United States Patent
Ashburn

[19]

[11] Patent Number: 6,054,343
[45] Date of Patent: Apr. 25, 2000

[54] NITRIDE TRENCH FILL PROCESS FOR INCREASING SHALLOW TRENCH ISOLATION (STI) ROBUSTNESS

[75] Inventor: Stanton Ashburn, McKinney, Tex.

[73] Assignee: Texas Instruments Incorporated, Dallas, Tex.

[21] Appl. No.: 09/234,565

[22] Filed: Jan. 20, 1999

Related U.S. Application Data

[60] Provisional application No. 60/072,489, Jan. 26, 1998.

[51] Int. Cl.[7] .................................................. H01L 21/60
[52] U.S. Cl. ........................ 438/221; 438/424; 438/359; 257/622; 257/510; 257/506
[58] Field of Search .................................... 438/221, 359, 438/424; 257/620, 622, 623, 510, 506

[56] References Cited

U.S. PATENT DOCUMENTS

| | | | |
|---|---|---|---|
| 4,923,821 | 5/1990 | Namose | 437/38 |
| 5,192,706 | 3/1993 | Rodder | 437/67 |
| 5,380,671 | 1/1995 | Lur et al. | 437/41 |
| 5,387,540 | 2/1995 | Poon et al. | 437/67 |
| 5,436,488 | 7/1995 | Poon et al. | 257/397 |
| 5,521,422 | 5/1996 | Mandelman et al. | 257/510 |
| 5,766,823 | 6/1998 | Fumitomo | 430/314 |
| 5,868,870 | 2/1999 | Fazan et al. | 148/33.3 |
| 5,895,254 | 4/1999 | Huang et al. | 438/424 |

*Primary Examiner*—Tom Thomas
*Assistant Examiner*—Douglas W. Owens
*Attorney, Agent, or Firm*—Jacquline J. Garner; Wade James Brady III; Frederick J. Telecky, Jr.

[57] ABSTRACT

A semiconductor device and method having shallow trench isolation. A pad oxide 24 and silicon 42 are formed on a substrate 20 to form a mask, and the pad oxide 24/silicon 42 mask is then patterned. Portions of the pad oxide 24/silicon 42 mask and the substrate 20 are removed to form trenches 22 in the substrate 20. A nitride fill 40 is deposited over the pad oxide 24/silicon 42 mask and the trenches 22. Advantages of the invention include a more robust STI device without central voids 34 and without edge voids 36 in the trench fill material.

10 Claims, 2 Drawing Sheets

NITRIDE TRENCH FILL PROCESS FOR INCREASING SHALLOW TRENCH ISOLATION (STI) ROBUSTNESS

This application claims priority under 35 USC § 119(e)(1) of provisional application number 60/072,489 filed Jan. 26, 1998.

FIELD OF THE INVENTION

This invention relates generally to the fabrication of semiconductor devices, and more specifically, to a trench isolation structure in an integrated circuit and its method of formation.

BACKGROUND OF THE INVENTION

Semiconductors are widely used in integrated circuits for electronic applications, including radios and televisions. Such integrated circuits typically use multiple transistors fabricated in single crystal silicon. Semiconductor devices are being scaled down in dimension to increase device performance and device density.

Shallow trench isolation is a technique used to reduce isolation width while maintaining the necessary electrical isolation between adjacent active devices. Shallow trench isolation (STI) is being used with integrated circuits in the 0.25 micrometers and below range to achieve necessary performance and design rules. Current STI processes primarily use silicon oxide to fill the shallow trenches and isolate devices.

SUMMARY OF THE INVENTION

Current STI processes primarily use silicon oxide to fill the shallow trenches and isolate devices. The oxides for the STI fill are typically deposited using chemical vapor deposition (CVD) techniques which result in oxide deposition on the trench bottom, sidewalls, and over the masking material used to define the trenches. This deposition nature results in a weak seam at the center of the trenches where the oxide from the two sides of the trenches come together. Silicon oxides are not resistant to HF(hydrogen fluoride)-containing solutions, which are heavily used in semiconductor processing (e.g., dummy gate preclean, pre-gate clean, K-contamination strip, pre-Ti deposition, clean, etc.), and the seam that forms by the deposition tends to etch at a higher rate than the bulk oxide film. The etching of the silicon oxides used for STI therefore results in the formation of voids along the weak seam that can fill with poly-Si in post processes, leading to gate to gate transistor shorting. Also, the trench fill oxide etches from the sides and top simultaneously, resulting in exposure of the trench top corner. This exposure of the trench top corner can result in the gate oxide and poly wrapping around the trench corner that can cause early channel turn-on around the edges of the transistors, which results in higher leakage current levels (double hump subthreshold characteristics). Exposure of the trench corner prior to gate oxidation may also result in gate oxide thinning at the corner, resulting in degradation of gate oxide integrity.

These problems with shallow trench formation are overcome by the present invention. The present invention is a method for manufacturing a semiconductor device, including the steps of providing a substrate, forming a pad oxide/silicon mask on the substrate, and patterning the pad oxide/silicon mask. Portions of the pad oxide/silicon mask and substrate are removed to form trenches in the substrate. A thermal oxide liner is then grown on the trench walls. A nitride fill is deposited over the pad oxide/silicon mask and the trenches. The present invention also is a semiconductor device comprising a substrate, where the substrate contains trenches and the trenches contain a nitride fill.

An optional sidewall nitride may be formed on the edges of the nitride trench fill following pad oxide/silicon removal, to further eliminate undercutting of nitride through liner oxide in post HF-processing.

The novel method of using a nitride fill for a trench fill material offers several advantages over the conventional oxide fill processes. The nitride fill is more resistant to HF-containing solutions. A central void is not formed during subsequent semiconductor processing steps, for example, from HF etching of the trench fill material. Also, edge voids are not formed in the nitride fill material at the top edges of the trench. This results in a much more robust STI semiconductor device that is absent manufacturing problems such as gate oxide wrapping around the trench corner, resulting in increased leakage current, or poly-Si deposition in the central voids, resulting in poly-gate strapping or shorting. The optional sidewall nitride further prevents undercutting of nitride through liner oxide in post HF processing.

DETAILED DESCRIPTION OF THE PREFERRED EMBODIMENTS

The making and use of the presently preferred embodiments are discussed below in detail. However, it should be appreciated that the present invention provides many applicable inventive concepts which may be embodied in a wide variety of specific contexts. The specific embodiments discussed are merely illustrative of specific ways to make and use the invention and do not limit the scope of the invention. The following is a description of several embodiments of the present invention, including manufacturing methods. Corresponding numerals and symbols in the different figures refer to corresponding parts unless otherwise indicated. Table 1 below provides an overview of the elements in the embodiments and the drawings.

TABLE I

| ELEMENT | GENERIC TERM | PREFERRED OR SPECIFIC EXAMPLES | OTHER ALTERNATE EXAMPLES OR DESCRIPTION |
| --- | --- | --- | --- |
| 18 | Semiconductor | — | — |
| 20 | Wafer Substrate | Silicon | May include other metal layers or semiconductor elements, e.g. GaAs, InP, Si/Ge, SiC |
| 22 | Trench | Trapezoidal-shaped recess in substrate 20 | — |
| 24 | Pad Oxide | $SiO_2$ | Other oxides, inorganic and organic dielectrics. |
| 26 | Liner Oxide | $SiO_2$ | Other oxides, inorganic and organic dielectrics. |
| 30 | Oxide Fill | Silicon Oxide | Other oxides. |
| 28 | Nitride Mask | SiN | Other nitrides. |
| 32 | Seam | Seam in oxide fill 30 near center of trench 22 | — |
| 34 | Central Void | Void at top of seam 32 of oxide fill 30 | — |
| 36 | Edge Void | Void at top corner edges of oxide fill 30 | — |
| 38 | Gate Oxide | $SiO_2$ | Other oxides or nitrides |
| 40 | Nitride Fill | SiN | Boron nitride; other nitrides; nitride trench fill. |
| 42 | Silicon | Polycrystalline silicon | Amorphous silicon. |
| 43 | Corner oxide | $SiO_2$ | Other oxides, inorganic and organic dielectrics. |
| 44 | Sidewall nitride | SiN | Other nitrides. |

Figure 1:
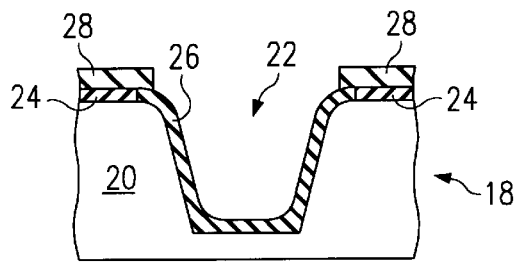
FIGS. 1–8 illustrate in cross section process steps in accordance with a prior art device and method of manufacturing.
Figure 2:
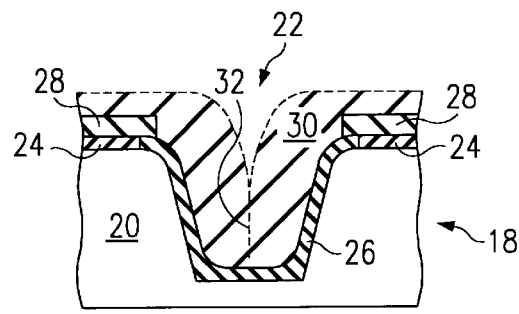
Figure 3:
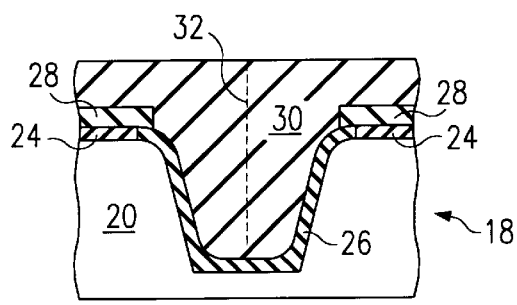
Figure 4:
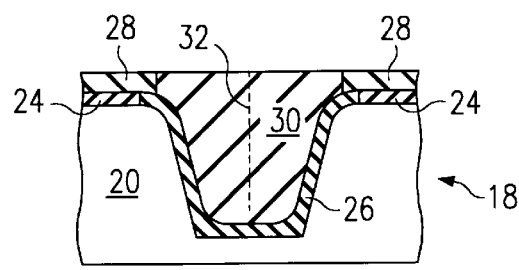

A common method used for manufacturing semiconductor devices having trench isolation will be discussed first and is illustrated in FIGS. 1–8. FIGS. 1 shows a semiconductor wafer 18, that has a substrate 20 which may, for example, contain transistors, diodes and other semiconductor elements, (not shown) as are well known in the art. The pad oxide 24 and a nitride mask 28 are deposited onto the substrate 20 and patterned using lithography to expose areas where trenches 22 will be formed. The nitride mask 28 and pad oxide 24 in the exposed regions are then etched by plasma, for example. The underlying substrate 20 is also etched in the exposed regions, forming trenches 22 in the substrate 20. After removal of the lithography photoresist, the pad oxide 24 is typically slightly etched back under the nitride mask 28 to expose the top corners of the trench 22. A thermal liner oxidation is then performed which rounds the corner of the trench 22 and forms a good electrical quality interface at the trench edges, leaving a liner oxide 26 along the bottom and sidewalls of the trench 22, as shown in FIG. 1. Next, an oxide fill 30 is deposited to fill the trenches as shown in FIG. 2. During the deposition of the oxide fill 30 a seam 32 is formed near the center of the trench 22, as shown in FIG. 3. Then, the oxide fill 30 is polished back using chemical mechanical polishing (CMP), for example, to planarize the surface and expose the nitride mask 28, as shown in FIG. 4. The nitride mask 28 is then removed using a wet etch, for example, leaving the structure shown in FIG. 5.

Figure 5:
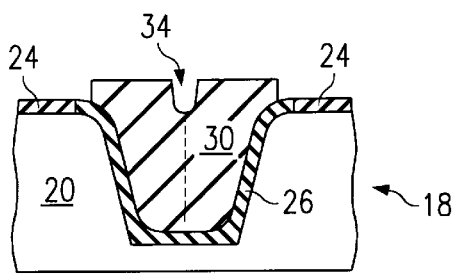

The method typically used to deposit the trench fill oxide 30 is chemical vapor deposition (CVD), which results in a seam 32 near the center of the trench 22 where the oxide 30 meets when depositing on each side as illustrated in FIGS. 2, 3 and 4. This seam 32 is a weak region compared to the remainder of the deposited oxide material 30, due to the lack of sufficient oxide bonding in the seam 32 area. Thus, when the oxide fill 30 is exposed to HF-containing solutions, the weak seam 32 etches more quickly than the rest of the oxide, which may lead to central voids 34 as illustrated in FIG. 5. These central voids 34 may fill with poly-Si and other processing materials in subsequent processing steps, which may lead to poly-gate strapping or shorts between adjacent gates of transistors.

Figure 6:
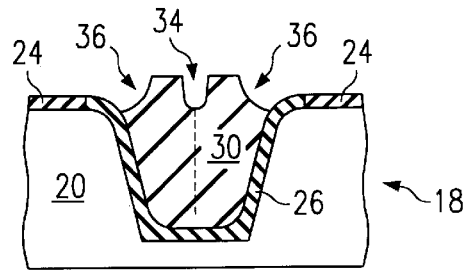
Figure 7:
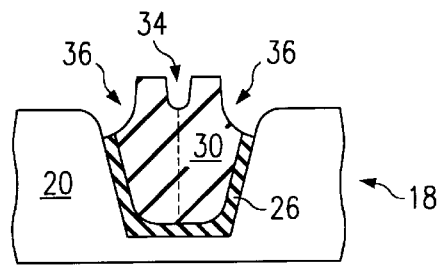
Figure 8:
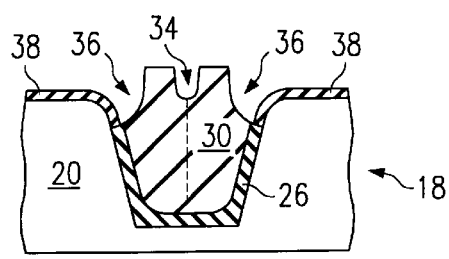

Another problem with the current method of shallow trench isolation trench fill is that the HF-containing solutions may etch the oxide fill 30 at the edges of the trench, creating edge voids 36 as illustrated in FIG. 6. The edge voids 36 pull the oxide fill 30 back, exposing the trench corners. A pre-gate cleaning step may then remove the liner oxide 26 at the trench corner as shown in FIG. 7. The subsequent step of gate oxidation may result in gate-oxide 38 wrapping around the corners of the trench as shown in FIG. 8, resulting in increased leakage current. The present invention, shown in FIGS. 9–11, solves these problems of the prior art. In the present invention a substrate 20 is provided and then pad oxide 24 and silicon 42 are deposited onto the substrate 20. The pad oxide 24/silicon 42 stack is typically formed by thermal oxidation of the silicon substrate 20 to a thickness in the range of 100 Å to 500 Å followed by silicon 42 deposition, for example, by chemical vapor deposition (CVD) using gases such as $SiH_4$ (silane), $Si_2H_6$ (disilane), or $SiCl_2H_2$ (dichlorosilane). The silicon 42 thickness is preferably in the range of 1000 Å–3000 Å. Preferably the silicon 42 comprises polycrystalline silicon, but it may also comprise amorphous silicon.

The pad oxide 24 and the silicon 42 are patterned using lithography to expose areas where trenches 22 will be formed. Exposed portions of the silicon 42, pad oxide 24, and substrate 20 are removed to create trenches 22 in the substrate 20. Typically, the trenches 22 are between 2000 Å to 6000 Å deep with a sidewall angle of 70° to 90° from the horizontal length of the wafer, although the present invention may be used for semiconductor devices having other trench depths. The silicon 42, pad oxide 24, and silicon substrate 20 are preferably etched using plasma etch processing, but other etch processes may be used. The pad oxide 24 is typically slightly etched back under the silicon 42 to expose the top corner of the trench 22. A thermal oxide liner is then grown on the trench walls which rounds the corner of the trench and forms a good quality interface at the trench faces by leaving liner oxide 26 deposited along the bottom and the sidewalls of the trenches 22. The thickness of the liner oxide 26 is, for example, 100 Å–600 Å, or an amount necessary to form a sufficient electrical interface with the silicon substrate 20. The silicon 42 will also partially oxidize during the liner oxidation, forming corner oxide 43, shown in FIG. 9. The corner oxide 43 provides more trench corner protection for the structure.

Figure 9:
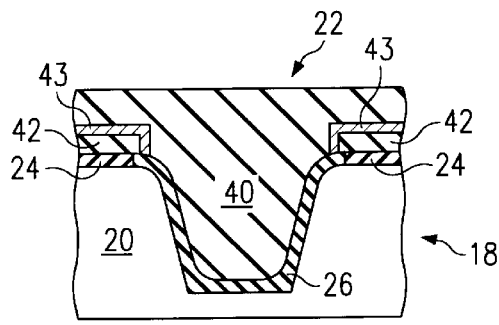
FIGS. 9–11 illustrate in cross section process steps in accordance with an embodiment of the present invention.
Figure 10:
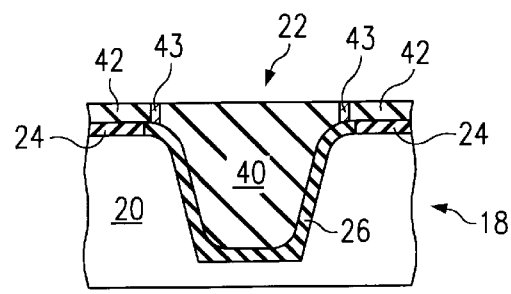
Figure 11:
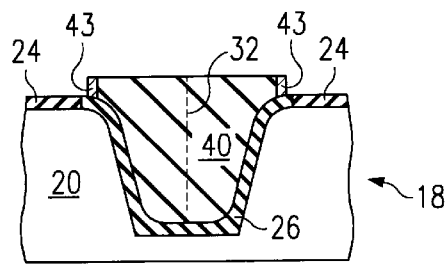

Next, a nitride trench fill material is deposited, leaving a nitride fill 40 residing over the corner oxide 43, silicon 42 and in the trenches 22, as shown in FIG. 9. The thickness of the nitride fill 40 is dependent upon the trench depth and pad oxide 24/silicon 42 thicknesses, but is typically in the range of 3,000 Å to 12,000 Å. The nitride fill 40 is deposited, for example, using $SiH_4$ (silane) or $SiH_2Cl_2$ (dichlorosilane) and $NH_3$ (ammonia) at approximately 600° C. to 800° C. using CVD. The nitride fill 40 and portions of the corner oxide 43 are then polished back using CMP (chemical mechanical polishing) to expose the silicon 42 as shown in FIG. 10. Next, the silicon 42 is removed, preferably by wet etching, resulting in the structure shown in FIG. 11 that is absent the central void 34 and edge voids 36 found in the techniques of the past (see FIG. 8). Subsequent processing steps may then be performed as required.

Figure 12:
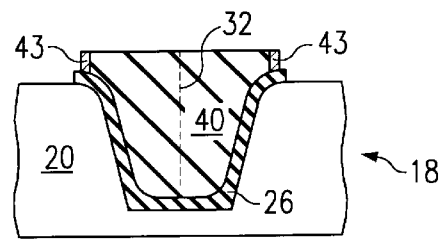
FIGS. 12 and 13 illustrate an optional embodiment of the present invention, with a sidewall nitride formed on the edges of the nitride trench fill.
Figure 13:
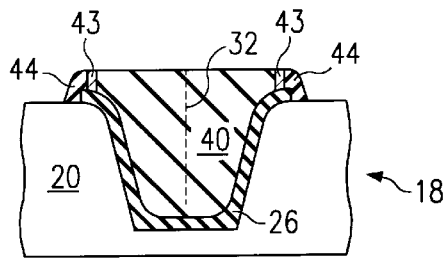

An optional embodiment of the present invention is shown in FIGS. 12 and 13. After the pad oxide 24 is removed (FIG. 12), an optional sidewall nitride 44 may be formed on the edges of the nitride trench fill 40. This sidewall nitride 44 may be formed, for example, by the deposition of a thin (approximately 200 Å–1000 Å) nitride layer using CVD processing, followed by plasma etching of the nitride layer to form the sidewall nitride 44 on the edges of the nitride fill 40. The sidewall nitride 44 further protects against undercutting of nitride through liner oxide in post HF processing.

The nitride fill 40 preferably comprises silicon nitride, but it may also comprise other nitrides such as boron nitride, for example. Such nitrides are resistant to HF and thus, even though a seam 32 may form in the trench 22, where the two sides meet during a nitride deposition, the seam 32 does not etch in HF solutions, and does not create a central void 34 as with the prior art. Also, the nitride fill 40 at the edges of the trench does not etch back in HF solutions to expose the trench corner, as in the prior art. The silicon 42 and pad oxide 24 may be chosen to provide a layer of poly-Si that may be selectively etched with respect to the nitride fill 40 material.

The novel method of using a nitride fill 40 for a trench fill material offers definite advantages over conventional processes. First, a central void 34 is not formed during subsequent semiconductor processing steps, for example, from HF etching of the trench fill material. Also, edge voids 36 are not formed in the nitride fill 40 material at the top edges of the trench 22. This results in a much more robust STI semiconductor device that is absent of manufacturing problems such as gate oxide wrapping around the trench corner, causing increased leakage current, and poly-Si deposition in the central voids, causing poly-gate strapping or shorting. The optional sidewall nitride 44 further protects against nitride undercutting through the liner oxide in subsequent HF processing steps.

While the invention has been described with reference to illustrative embodiments, this description is not intended to be construed in a limiting sense. Various modifications and combinations of the illustrative embodiments, as well as, other embodiments of the invention will be apparent to a person skilled in the art of upon reference to the description. It is therefore intended that the impended claims encompass any such modifications or embodiments.

What is claimed is:

1. A method for manufacturing a semiconductor device having shallow trench isolation, comprising the steps of:

providing a substrate;

forming a pad oxide/silicon mask on said substrate;

patterning said pad oxide/silicon mask;

removing portions of said pad oxide/silicon mask and said substrate to form a trench in said substrate, said trench having a bottom and sidewalls;

forming a liner oxide on said bottom and said sidewalls of said trench and concurrently oxidizing exposed portions of said silicon mask extending over the corners of said trench;

depositing a nitride fill over said pad oxide/silicon mask and said trench; and removing the unoxidized portion of said silicon mask and the oxidized portion of said silicon mask not extending over the corners of said trench while retaining the oxidized portions of said silicon mask extending over said corners of said trench.

2. The method of claim 1, further comprising the step of removing portions of said nitride fill residing over said pad oxide/silicon mask, after said step of depositing a nitride.

3. The method of claim 2, further comprising the step of depositing a gate oxide, after said step of removing said pad oxide/silicon mask.

4. The method of claim 1, wherein said step of depositing a nitride fill comprises depositing silicon nitride.

5. The method of claim 1, wherein said step of depositing a nitride fill comprises depositing boron nitride.

6. A method for manufacturing a semiconductor device having shallow trench isolation, comprising the steps of:

providing a substrate;

forming a pad oxide/silicon mask on said substrate;

patterning said pad oxide/silicon mask;

removing portions of said pad oxide/silicon mask and said substrate to form a trench in said substrate, said trench having a bottom and sidewalls;

forming a liner oxide on said bottom and said sidewalls of said trench and concurrently oxidizing exposed portions of said silicon mask extending over the corners of said trench;

depositing a nitride fill over said pad oxide/silicon mask and said liner oxide; and removing the unoxidized portion of said silicon mask and the oxidized portion of said silicon mask not extending over the corners of said trench while retaining the oxidized portions of said silicon mask extending over said corners of said trench.

7. The method of claim 6, further comprising the step of removing portions of said nitride fill residing over said pad oxide/silicon mask, after said step of depositing a nitride fill.

8. The method of claim 7, further comprising the step of depositing a gate oxide, after said step of removing said pad oxide/silicon mask.

9. The method of claim 6, wherein said step of depositing a nitride fill comprises depositing silicon nitride.

10. The method of claim 6, wherein said step of depositing a nitride fill comprises depositing boron nitride.

* * * * *